(12) United States Patent
Davis et al.

(10) Patent No.: US 8,736,138 B2
(45) Date of Patent: *May 27, 2014

(54) CARBON NANOTUBE MEMS ASSEMBLY

(75) Inventors: Robert C. Davis, Provo, UT (US);
Richard R. Vanfleet, Provo, UT (US);
David N. Hutchison, Ithaca, NY (US)

(73) Assignee: Brigham Young University, Provo, UT (US)

( * ) Notice: Subject to any disclaimer, the term of this patent is extended or adjusted under 35 U.S.C. 154(b) by 53 days.

This patent is subject to a terminal disclaimer.

(21) Appl. No.: 12/239,302

(22) Filed: Sep. 26, 2008

(65) Prior Publication Data

US 2009/0085426 A1 Apr. 2, 2009

Related U.S. Application Data

(60) Provisional application No. 60/995,881, filed on Sep. 28, 2007.

(51) Int. Cl.
*H02N 1/00* (2006.01)
*H02N 10/00* (2006.01)

(52) U.S. Cl.
USPC ........... 310/309; 310/306; 310/307; 310/308; 977/725

(58) Field of Classification Search
USPC ........ 310/306–309; 423/447.3; 977/753, 724, 977/725
See application file for complete search history.

(56) References Cited

U.S. PATENT DOCUMENTS

| | | | |
|---|---|---|---|
| 1,276,706 A | 5/1918 | Snook et al. |
| 1,881,448 A | 10/1932 | Forde et al. |
| 1,946,288 A | 2/1934 | Kearsley |
| 2,291,948 A | 8/1942 | Cassen |
| 2,316,214 A | 4/1943 | Atlee et al. |
| 2,329,318 A | 9/1943 | Atlee et al. |
| 2,340,363 A | 2/1944 | Atlee et al. |
| 2,502,070 A | 3/1950 | Atlee et al. |
| 2,683,223 A | 7/1954 | Hosemann |
| 2,952,790 A | 9/1960 | Steen |
| 3,218,559 A | 11/1965 | Applebaum |
| 3,397,337 A | 8/1968 | Denholm |
| 3,434,062 A | 3/1969 | Cox |
| 3,358,368 A | 11/1970 | Oess |
| 3,665,236 A | 5/1972 | Gaines et al. |
| 3,679,927 A | 7/1972 | Kirkendall |

(Continued)

FOREIGN PATENT DOCUMENTS

| DE | 1030936 | 5/1958 |
|---|---|---|
| DE | 4430623 | 3/1996 |

(Continued)

OTHER PUBLICATIONS

Vajtai et al.,"Building Carbon Nanotubes and their smart architectures", Smart Mater.Struct. 11 (2002) 691-698.*

(Continued)

*Primary Examiner* — Terrance Kenerly

(57) ABSTRACT

A carbon nanotube MEMS assembly comprises a plurality of carbon nanotubes oriented into a patterned frame, the patterned frame defining at least two components of a MEMS device. An interstitial material at least partially binds adjacent carbon nanotubes one to another. At least one component of the frame is fixed and at least one component of the frame is movable relative to the fixed component.

13 Claims, 6 Drawing Sheets

(56) References Cited

U.S. PATENT DOCUMENTS

| | | |
|---|---|---|
| 3,691,417 A | 9/1972 | Gralenski |
| 3,741,797 A | 6/1973 | Chavasse, Jr. et al. |
| 3,751,701 A | 8/1973 | Gralenski et al. |
| 3,801,847 A | 4/1974 | Dietz |
| 3,828,190 A | 8/1974 | Dahlin et al. |
| 3,851,266 A | 11/1974 | Conway |
| 3,872,287 A | 3/1975 | Kooman |
| 3,882,339 A | 5/1975 | Rate et al. |
| 3,962,583 A | 6/1976 | Holland et al. |
| 3,970,884 A | 7/1976 | Golden |
| 3,356,559 A | 12/1976 | Mohn et al. |
| 4,007,375 A | 2/1977 | Albert |
| 4,075,526 A | 2/1978 | Grubis |
| 4,160,311 A | 7/1979 | Ronde et al. |
| 4,178,509 A | 12/1979 | More et al. |
| 4,184,097 A | 1/1980 | Auge |
| 4,293,373 A | 10/1981 | Greenwood |
| 4,368,538 A | 1/1983 | McCorkle |
| 4,393,127 A | 7/1983 | Greschner et al. |
| 4,421,986 A | 12/1983 | Friauf et al. |
| 4,443,293 A | 4/1984 | Mallon et al. |
| 4,463,338 A | 7/1984 | Utner et al. |
| 4,504,895 A | 3/1985 | Steigerwald |
| 4,521,902 A | 6/1985 | Peugeot |
| 4,532,150 A | 7/1985 | Endo et al. |
| 4,573,186 A | 2/1986 | Reinhold |
| 4,576,679 A | 3/1986 | White |
| 4,584,056 A | 4/1986 | Perret et al. |
| 4,591,756 A | 5/1986 | Avnery |
| 4,608,326 A | 8/1986 | Neukermans et al. |
| 4,645,977 A | 2/1987 | Kurokawa et al. |
| 4,675,525 A | 6/1987 | Amingual et al. |
| 4,679,219 A | 7/1987 | Ozaki |
| 4,688,241 A | 8/1987 | Peugeot |
| 4,696,994 A | 9/1987 | Nakajima et al. |
| 4,705,540 A | 11/1987 | Hayes |
| 4,777,642 A | 10/1988 | Ono |
| 4,797,907 A | 1/1989 | Anderton |
| 4,818,806 A | 4/1989 | Kunimune et al. |
| 4,819,260 A | 4/1989 | Haberrecker |
| 4,862,490 A | 8/1989 | Karnezos et al. |
| 4,870,671 A | 9/1989 | Hershyn |
| 4,876,330 A | 10/1989 | Higashi et al. |
| 4,878,866 A | 11/1989 | Mori et al. |
| 4,885,055 A | 12/1989 | Woodbury et al. |
| 4,891,831 A | 1/1990 | Tanaka et al. |
| 4,933,557 A | 6/1990 | Perkins |
| 4,939,763 A | 7/1990 | Pinneo et al. |
| 4,957,773 A | 9/1990 | Spencer et al. |
| 4,960,486 A | 10/1990 | Perkins et al. |
| 4,969,173 A | 11/1990 | Valkonet |
| 4,979,198 A | 12/1990 | Malcolm et al. |
| 4,979,199 A | 12/1990 | Cueman et al. |
| 5,010,562 A | 4/1991 | Hernandez et al. |
| 5,063,324 A | 11/1991 | Grunwald et al. |
| 5,066,300 A | 11/1991 | Isaacson et al. |
| 5,077,771 A | 12/1991 | Skillicorn et al. |
| 5,077,777 A | 12/1991 | Daly |
| 5,090,046 A | 2/1992 | Friel |
| 5,105,456 A | 4/1992 | Rand et al. |
| 5,117,829 A | 6/1992 | Miller et al. |
| 5,153,900 A | 10/1992 | Nomikos et al. |
| 5,161,179 A | 11/1992 | Suzuki et al. |
| 5,173,612 A | 12/1992 | Imai et al. |
| 5,178,140 A | 1/1993 | Ibrahim |
| 5,217,817 A | 6/1993 | Verspui et al. |
| 5,226,067 A | 7/1993 | Allred et al. |
| RE34,421 E | 10/1993 | Parker et al. |
| 5,258,091 A | 11/1993 | Imai et al. |
| 5,267,294 A | 11/1993 | Kuroda et al. |
| 5,302,523 A | 4/1994 | Coffee et al. |
| 5,343,112 A | 8/1994 | Wegmann |
| 5,391,958 A | 2/1995 | Kelly |
| 5,392,042 A | 2/1995 | Pellon |
| 5,400,385 A | 3/1995 | Blake et al. |
| 5,422,926 A | 6/1995 | Smith et al. |
| 5,428,658 A | 6/1995 | Oettinger et al. |
| 5,432,003 A | 7/1995 | Plano et al. |
| 5,469,429 A | 11/1995 | Yamazaki et al. |
| 5,469,490 A | 11/1995 | Golden et al. |
| 5,478,266 A | 12/1995 | Kelly |
| 5,521,851 A | 5/1996 | Wei et al. |
| 5,524,133 A | 6/1996 | Neale et al. |
| RE35,383 E | 11/1996 | Miller et al. |
| 5,571,616 A | 11/1996 | Phillips et al. |
| 5,578,360 A | 11/1996 | Viitanen |
| 5,602,507 A | 2/1997 | Suzuki |
| 5,607,723 A | 3/1997 | Plano et al. |
| 5,621,780 A | 4/1997 | Smith et al. |
| 5,627,871 A | 5/1997 | Wang |
| 5,631,943 A | 5/1997 | Miles |
| 5,680,433 A | 10/1997 | Jensen |
| 5,682,412 A | 10/1997 | Skillicorn et al. |
| 5,696,808 A | 12/1997 | Lenz |
| 5,706,354 A | 1/1998 | Stroehlein |
| 5,729,583 A | 3/1998 | Tang et al. |
| 5,774,522 A | 6/1998 | Warburton |
| 5,812,632 A | 9/1998 | Schardt et al. |
| 5,835,561 A | 11/1998 | Moorman et al. |
| 5,870,051 A | 2/1999 | Warburton |
| 5,898,754 A | 4/1999 | Gorzen |
| 5,907,595 A | 5/1999 | Sommerer |
| 6,002,202 A | 12/1999 | Meyer et al. |
| 6,005,918 A | 12/1999 | Harris et al. |
| 6,044,130 A | 3/2000 | Inazura et al. |
| 6,062,931 A | 5/2000 | Chuang et al. |
| 6,063,629 A | 5/2000 | Knoblauch |
| 6,069,278 A | 5/2000 | Chuang |
| 6,073,484 A * | 6/2000 | Miller et al. .................... 73/105 |
| 6,075,839 A | 6/2000 | Treseder |
| 6,097,790 A | 8/2000 | Gasegawa et al. |
| 6,129,901 A * | 10/2000 | Moskovits et al. ........ 423/447.3 |
| 6,133,401 A | 10/2000 | Jensen |
| 6,134,300 A | 10/2000 | Trebes et al. |
| 6,184,333 B1 | 2/2001 | Gray |
| 6,205,200 B1 | 3/2001 | Boyer et al. |
| 6,277,318 B1 | 8/2001 | Bower |
| 6,282,263 B1 | 8/2001 | Arndt et al. |
| 6,288,209 B1 | 9/2001 | Jensen |
| 6,307,008 B1 | 10/2001 | Lee et al. |
| 6,320,019 B1 | 11/2001 | Lee et al. |
| 6,351,520 B1 | 2/2002 | Inazaru |
| 6,385,294 B2 | 5/2002 | Suzuki et al. |
| 6,388,359 B1 * | 5/2002 | Duelli et al. .................. 310/309 |
| 6,438,207 B1 | 8/2002 | Chidester et al. |
| 6,477,235 B2 | 11/2002 | Chornenky et al. |
| 6,487,272 B1 | 11/2002 | Kutsuzawa |
| 6,487,273 B1 | 11/2002 | Takenaka et al. |
| 6,494,618 B1 | 12/2002 | Moulton |
| 6,546,077 B2 | 4/2003 | Chornenky et al. |
| 6,567,500 B2 | 5/2003 | Rother |
| 6,645,757 B1 | 11/2003 | Okandan et al. |
| 6,646,366 B2 | 11/2003 | Hell et al. |
| 6,658,085 B2 | 12/2003 | Sklebitz |
| 6,661,876 B2 | 12/2003 | Turner et al. |
| 6,740,874 B2 | 5/2004 | Doring |
| 6,778,633 B1 | 8/2004 | Loxley et al. |
| 6,799,075 B1 | 9/2004 | Chornenky et al. |
| 6,803,570 B1 | 10/2004 | Bryson, III et al. |
| 6,803,571 B1 | 10/2004 | Mankos et al. |
| 6,816,573 B2 | 11/2004 | Hirano et al. |
| 6,819,741 B2 | 11/2004 | Chidester |
| 6,838,297 B2 | 1/2005 | Iwasaki et al. |
| 6,852,365 B2 | 2/2005 | Smart et al. |
| 6,866,801 B1 | 3/2005 | Mau et al. |
| 6,876,724 B2 | 4/2005 | Zhou |
| 6,900,580 B2 | 5/2005 | Dai et al. |
| 6,956,706 B2 | 10/2005 | Brandon |
| 6,962,782 B1 | 11/2005 | Livache et al. |
| 6,976,953 B1 | 12/2005 | Pelc |
| 6,987,835 B2 | 1/2006 | Lovoi |
| 7,035,379 B2 | 4/2006 | Turner et al. |
| 7,046,767 B2 | 5/2006 | Okada et al. |
| 7,049,735 B2 | 5/2006 | Ohkubo et al. |

(56) References Cited

U.S. PATENT DOCUMENTS

| | | | |
|---|---|---|---|
| 7,050,539 B2 | 5/2006 | Loef et al. | |
| 7,075,699 B2* | 7/2006 | Oldham et al. | 359/290 |
| 7,085,354 B2 | 8/2006 | Kanagami | |
| 7,108,841 B2 | 9/2006 | Smalley et al. | |
| 7,110,498 B2 | 9/2006 | Yamada | |
| 7,130,380 B2 | 10/2006 | Lovoi et al. | |
| 7,130,381 B2 | 10/2006 | Lovoi et al. | |
| 7,189,430 B2 | 3/2007 | Ajayan et al. | |
| 7,203,283 B1 | 4/2007 | Puusaari | |
| 7,206,381 B2 | 4/2007 | Shimono et al. | |
| 7,215,741 B2 | 5/2007 | Ukita | |
| 7,224,769 B2 | 5/2007 | Turner | |
| 7,233,071 B2 | 6/2007 | Furukawa et al. | |
| 7,233,647 B2 | 6/2007 | Turner et al. | |
| 7,286,642 B2 | 10/2007 | Ishikawa et al. | |
| 7,305,066 B2 | 12/2007 | Ukita | |
| 7,317,784 B2 | 1/2008 | Durst et al. | |
| 7,358,593 B2 | 4/2008 | Smith et al. | |
| 7,382,862 B2 | 6/2008 | Bard et al. | |
| 7,428,298 B2 | 9/2008 | Bard et al. | |
| 7,448,801 B2 | 11/2008 | Oettinger et al. | |
| 7,448,802 B2 | 11/2008 | Oettinger et al. | |
| 7,486,774 B2 | 2/2009 | Cain | |
| 7,526,068 B2 | 4/2009 | Dinsmore | |
| 7,529,345 B2 | 5/2009 | Bard et al. | |
| 7,618,906 B2 | 11/2009 | Meilahti | |
| 7,634,052 B2 | 12/2009 | Grodzins et al. | |
| 7,649,980 B2 | 1/2010 | Aoki et al. | |
| 7,650,050 B2 | 1/2010 | Haffner et al. | |
| 7,657,002 B2 | 2/2010 | Burke et al. | |
| 7,675,444 B1 | 3/2010 | Smith et al. | |
| 7,680,652 B2 | 3/2010 | Giesbrecht et al. | |
| 7,693,265 B2 | 4/2010 | Hauttmann et al. | |
| 7,709,820 B2 | 5/2010 | Decker et al. | |
| 7,737,424 B2 | 6/2010 | Xu et al. | |
| 7,756,251 B2* | 7/2010 | Davis et al. | 378/161 |
| 2002/0075999 A1 | 6/2002 | Rother | |
| 2002/0094064 A1 | 7/2002 | Zhou | |
| 2003/0096104 A1* | 5/2003 | Tobita et al. | 428/332 |
| 2003/0117770 A1 | 6/2003 | Montgomery et al. | |
| 2003/0142169 A1* | 7/2003 | Maeng et al. | 347/47 |
| 2003/0152700 A1 | 8/2003 | Asmussen et al. | |
| 2003/0165418 A1* | 9/2003 | Ajayan et al. | 423/447.2 |
| 2004/0076260 A1 | 4/2004 | Charles Jr. et al. | |
| 2004/0131835 A1* | 7/2004 | Schmitt et al. | 428/293.1 |
| 2005/0018817 A1 | 1/2005 | Oettinger et al. | |
| 2005/0141669 A1 | 6/2005 | Shimono et al. | |
| 2005/0207537 A1 | 9/2005 | Ukita | |
| 2006/0032329 A1* | 2/2006 | Rubinstein et al. | 75/255 |
| 2006/0073682 A1 | 4/2006 | Furukawa et al. | |
| 2006/0098778 A1 | 5/2006 | Oettinger et al. | |
| 2006/0131646 A1* | 6/2006 | Wu | 257/335 |
| 2006/0210020 A1 | 9/2006 | Takahashi et al. | |
| 2006/0233307 A1 | 10/2006 | Dinsmore | |
| 2006/0269048 A1 | 11/2006 | Cain | |
| 2006/0280289 A1 | 12/2006 | Hanington et al. | |
| 2007/0025516 A1 | 2/2007 | Bard et al. | |
| 2007/0087436 A1 | 4/2007 | Miyawaki et al. | |
| 2007/0111617 A1 | 5/2007 | Meilahti | |
| 2007/0133921 A1 | 6/2007 | Haffner et al. | |
| 2007/0142781 A1 | 6/2007 | Sayre | |
| 2007/0165780 A1 | 7/2007 | Durst et al. | |
| 2007/0172104 A1 | 7/2007 | Nishide | |
| 2007/0183576 A1 | 8/2007 | Burke et al. | |
| 2007/0217574 A1 | 9/2007 | Beyerlein | |
| 2008/0199399 A1 | 8/2008 | Chen et al. | |
| 2008/0296479 A1 | 12/2008 | Anderson et al. | |
| 2008/0296518 A1 | 12/2008 | Xu et al. | |
| 2008/0317982 A1 | 12/2008 | Hecht | |
| 2009/0085426 A1* | 4/2009 | Davis et al. | 310/306 |
| 2009/0086923 A1* | 4/2009 | Davis et al. | 378/161 |
| 2009/0213914 A1 | 8/2009 | Dong et al. | |
| 2009/0243028 A1 | 10/2009 | Dong et al. | |
| 2010/0119708 A1 | 5/2010 | Overzet et al. | |
| 2010/0126660 A1 | 5/2010 | O'Hara | |
| 2010/0189225 A1 | 7/2010 | Ernest et al. | |
| 2010/0239828 A1 | 9/2010 | Cornaby et al. | |
| 2010/0243895 A1 | 9/2010 | Xu et al. | |
| 2010/0248343 A1 | 9/2010 | Aten et al. | |
| 2010/0285271 A1* | 11/2010 | Davis et al. | 428/131 |
| 2010/0323419 A1 | 12/2010 | Aten et al. | |

FOREIGN PATENT DOCUMENTS

| | | | |
|---|---|---|---|
| DE | 19818057 | 11/1999 | |
| EP | 0297808 | 1/1989 | |
| EP | 0330456 | 8/1989 | |
| GB | 1252290 | 11/1971 | |
| JP | 57082954 | 8/1982 | |
| JP | 3170673 | 7/1991 | |
| JP | 05066300 | 3/1993 | |
| JP | 5135722 | 6/1993 | |
| JP | 06119893 | 7/1994 | |
| JP | 6289145 | 10/1994 | |
| JP | 6343478 | 12/1994 | |
| JP | 8315783 | 11/1996 | |
| JP | 2003/007237 | 1/2003 | |
| JP | 2003/088383 | 3/2003 | |
| JP | 2003-510236 | 3/2003 | |
| JP | 2003211396 * | 7/2003 | B81B 3/00 |
| JP | 4171700 | 6/2006 | |
| JP | 2006-297549 | 11/2006 | |
| KR | 10-2005-0107094 | 11/2005 | |
| WO | WO96-19738 | 6/1996 | |
| WO | WO99/65821 | 12/1999 | |
| WO | WO00/09443 | 2/2000 | |
| WO | WO00/17102 | 3/2000 | |
| WO | WO03/076951 | 9/2003 | |
| WO | WO 2008/052002 | 5/2008 | |
| WO | WO 2009/009610 | 1/2009 | |
| WO | WO 2009/045915 | 4/2009 | |
| WO | WO 2009/085351 | 7/2009 | |
| WO | WO 2010/107600 | 9/2010 | |

OTHER PUBLICATIONS

Anderson et al., U.S. Appl. No. 11/756,962, filed Jun. 1, 2007.

Barkan et al., "Improved window for low-energy x-ray transmission a Hybrid design for energy-dispersive microanalysis," Sep. 1995, 2 pages, Ectroscopy 10(7).

Blanquart et al.; "XPAD, a New Read-out Pixel Chip for X-ray Counting"; IEEE Xplore; Mar. 25, 2009.

Comfort, J. H., "Plasma-enhanced chemical vapor deposition of in situ doped epitaxial silicon at low temperatures," J. Appl. Phys. 65, 1067 (1989).

Das, D. K., and K. Kumar, "Chemical vapor deposition of boron on a beryllium surface," Thin Solid Films, 83(1), 53-60.

Das, K., and Kumar, K., "Tribological behavior of improved chemically vapor-deposited boron on beryllium," Thin Solid Films, 108(2), 181-188.

Gevin, et al IDe-XV1.0: Performances of a New CMOS Multi channer Analogue Readout ASIC for Cd (Zn) Te Detectors; IEEE 2005.

Grybos et al.; "DEDIX—Development of Fully Integrated Multichannel ASIC for High Count Rate Digital X-ray Imagining systems"; IEEE 2006; Nuclear Science Symposium Conference Record.

Grybos, "Pole-Zero Cancellations Circuit With Pulse Pile-Up Tracking System for Low Noise Charge-Sensitive Amplifiers"; Mar. 25, 2009; from IEEE Xplore.

Grybos, et al "Measurements of Matching and High Count Rate Performance of Multichannel ASIC for Digital X-Ray Imaging Systems"; IEEE Transactions on Nuclear Science, vol. 54, No. 4, 2007.

Hanigofsky, J. A., K. L. More, and W. J. Lackey, "Composition and microstructure of chemically vapor-deposited boron nitride, aluminum nitride, and boron nitride + aluminum nitride composites," J. Amer. Ceramic Soc. 74, 301 (1991).

Komatsu, S., and Y. Moriyoshi, "Influence of atomic hydrogen on the growth reactions of amorphous boron films in a low-pressure $B_2H_6$ +He+$H_2$ plasma", J. Appl. Phys. 64, 1878 (1988).

Komatsu, S., and Y. Moriyoshi, "Transition from amorphous to crystal growth of boron films in plasma-enhanced chemical vapor deposition with $B_2H_6$ +He," J. Appl. Phys., 66, 466 (1989).

(56) References Cited

OTHER PUBLICATIONS

Komatsu, S., and Y. Moriyoshi, "Transition from thermal-to electron-impact decomposition of diborane in plasma-enhanced chemical vapor deposition of boron films from $B_2H_6$ +He," J. Appl. Phys. 66, 1180 (1989).
Lee, W., W. J. Lackey, and P. K. Agrawal, "Kinetic analysis of chemical vapor deposition of boron nitride," J. Amer. Ceramic Soc. 74, 2642 (1991).
Lines, U.S. Appl. No. 12/352,864, filed Jan. 13, 2009.
Lines, U.S. Appl. No. 12/726,120, filed Mar. 17, 2010.
Ma, R.Z., et al., "Processing and properties of carbon nanotubes-nano-SIC ceramic", Journal of Materials Science 1998, pp. 5243-5246, vol. 33.
Maya, L., and L. A. Harris, "Pyrolytic deposition of carbon films containing nitrogen and/or boron," J. Amer. Ceramic Soc. 73, 1912 (1990).
Michaelidis, M., and R. Pollard, "Analysis of chemical vapor deposition of boron," J. Electrochem. Soc. 132, 1757 (1985).
Moore, A. W., S. L. Strong, and G. L. Doll, "Properties and characterization of codeposited boron nitride and carbon materials," J. Appl. Phys. 65, 5109 (1989).
Nakamura, K., "Preparation and properties of amorphous boron nitride films by molecular flow chemical vapor deposition," J. Electrochem. Soc. 132, 1757 (1985).
Panayiotatos, et al., "Mechanical performance and growth characteristics of boron nitride films with respect to their optical, compositional properties and density," Surface and Coatings Technology, 151-152 (2002) 155-159.
PCT Application PCT/US08/65346; filed May 30, 2008; Keith Decker.
PCT Application PCT/US10/56011; filed Nov. 9, 2010; Krzysztof Kozaczek.
Perkins, F. K., R. A. Rosenberg, and L. Sunwoo, "Synchrotronradiation deposition of boron and boron carbide films from boranes and carboranes: decaborane," J. Appl. Phys. 69,4103 (1991).
Powell et al., "Metalized polyimide filters for x-ray astronomy and other applications," SPIE, pp. 432-440, vol. 3113.
Rankov. A. "A Novel Correlated Double Sampling Poly-Si Circuit for Readout System in Large Area X-Ray Sensors", 2005.
Roca i Cabarrocas, P., S. Kumar, and B. Drevillon, "In situ study of the thermal decomposition of $B_2H_6$ by combining spectroscopic ellipsometry and Kelvin probe measurements," J. Appl. Phys. 66, 3286 (1989).
Scholze et al., "Detection efficiency of energy-dispersive detectors with low-energy windows" X-Ray Spectrometry, X-Ray Spectrom, 2005: 34: 473-476.
Shirai, K., S.-I. Gonda, and S. Gonda, "Characterization of hydrogenated amorphous boron films prepared by electron cyclotron resonance plasma chemical vapor deposition method," J. Appl. Phys. 67, 6286 (1990).
Tamura, et al "Developmenmt of ASICs for CdTe Pixel and Line Sensors", IEEE Transactions on Nuclear Science, vol. 52, No, 5, Oct. 2005.
Tien-Hui Lin et al., "An investigation on the films used as teh windows of ultra-soft X-ray counters." Acta Physica Sinica, vol. 27, No. 3, pp. 276-83, May 1978, abstract only.
U.S. Appl. No. 12/640,154, filed Dec. 17, 2009; Krzysztof Kozaczek.
U.S. Appl. No. 12/726,120, filed Mar. 17, 2010; Michael Lines.
U.S. Appl. No. 12/783,707, filed May 20, 2010; Steven D. Liddiard.
U.S. Appl. No. 12/899,750, filed Oct. 7, 2010; Steven Liddiard.
U.S. Appl. No. 13/018,667, filed Feb. 1, 2011; Lei Pei.
Vandenbulcke, L. G., "Theoretical and experimental studies on the chemical vapor deposition of boron carbide," Indust. Eng. Chem. Prod. Res. Dev. 24, 568 (1985).
Viitanen Veli-Pekka et al., Comparison of Ultrathin X-Ray Window Designs, presented at the Soft X-rays in the 21st Century Conference held in Provo, utah Feb. 10-13, 1993, pp. 182-190.
Wagner et al, "Effects of Scatter in Dual-Energy Imaging: An Alternative Analysis"; IEEE; Sep. 1989, vol. 8. No. 3.
Winter, J., H. G. Esser, and H. Reimer, "Diborane-free boronization," Fusion Technol. 20, 225 (1991).
www.moxtek,com, Moxtek, Sealed Proportional Counter X-Ray Windows, Oct. 2007, 3 pages.
www.moxtek.com, Moxtek, AP3 Windows, Ultra-thin Polymer X-Ray Windows, Sep. 2006, 2 pages.
www.moxtek.com, Moxtek, DuraBeryllium X-Ray Windows, May 2007, 2 pages.
www.moxtek.com, Moxtek, ProLine Series 10 Windows, Ultra-thin Polymer X-Ray Windows, Sep. 2006, 2 pages.
www.moxtek.com, X-Ray Windows, ProLINE Series 20 Windows Ultra-thin Polymer X-ray Windows, 2 pages. Applicant believes that this product was offered for sale prior to the filed of applicant's application.
Hutchison, "Vertically aligned carbon nanotubes as a framework for microfabrication of high aspect ration mems," 2008, pp. 1-50.
Ma, R. Z., at al., "Processing and properties of carbon nanotubes-nano-SiC ceramic," Journal of Materials Science 1998, pp. 5243-5246, vol. 33.
Chen, Xiaohua et al., "Cabon-nanotube metal-matrix composites prepared by electroless plating," Composites Science and Technology, 2000, pp. 301-306, vol. 60.
Flahaut, E. et al., "Carbon Nanotube-metal-oxide nanocomposites: microstructure, electrical conductivity and mechanical properties," Acta mater., 2000, pp. 3803-3812, vol. 48.
Peigney, et al., "Carbon nanotubes in novel ceramic matrix nanocomposites," Ceramics International, 2000, pp, 677-683, vol. 26.
Satishkumar B.C., et al., "Synthesis of metal oxide nanorods using carbon nanotubes as templates," Journal of Materials Chemistry, 2000, pp. 2115-2119, vol. 10.
Li, Jun et al., "Bottom-up approach for carbon nanotube interconnects," Applied Physics Letters, Apr. 14, 2003, pp. 2491-2493, vol. 82 No. 15.
Jiang, Linqin et al., "Carbon nanotubes-metal nitride composites: a new class of nanocomposites with enhanced electrical properties," J. Mater.Chem., 2005, pp. 260-266, vol. 15.
Yan, Xing-Bin, et al., Fabrication of Three-Dimensional ZnO-Carbon Nanotube (CNT) Hybrids Using Self-Assembled CNT Micropatterns as Framework, 2007, pp. 1724-17259, vol. 111.
http://www.orau.org/ptp/collectio/xraytubescollidge/
MachlettCW250T.htm, 1999, 2 pages.
Micro X-ray Tubem Operation Manual, X-ray and Specialty Instruments Inc., 1996, 5 pages.
Sheather, "The support of thin windows for x-ray proportional countrers," Journal Phys. E., Apr. 1973, pp. 319-322, vol. 6, No. 4.
U.S. Appl. No. 12/640,154, filed Dec. 17, 2009; Krzysztof Kozaczek; office action issued Apr. 26, 2011.
U.S. Appl. No. 12/640,154, filed Dec. 17, 2009; Krzysztof Kozaczek; notice of allowance issued May 23, 2011.
U.S. Appl. No. 12/640,154, filed Dec. 17, 2009; Krzysztof Kozaczek; office action issued Jun. 9, 2011.
U.S. Appl. No. 12/407,457, filed Mar. 19, 2009; Sterling W. Cornaby; office action issued Jun. 14, 2011.
U.S. Appl. No. 12/239,281, filed Sep. 26, 2008; Robert C. Davis; office action issued Dec. 13, 2011.
U.S. Appl. No. 12/814,912, filed Jun. 14, 2010; Degao Xu; office action issued Dec. 5, 2011.
Vajtai et al; Building Carbon Nanotubes and Their Smart Architectures; Smart Mater. Struct. 2002; pp. 691-698; vol. 11.
U.S. Appl. No. 12/239,281, filed Sep. 26, 2008; Robert C. Davis; office action issued May 24, 2012.
PCT Application PCT/US2011/044168; filed Jul. 15, 2011; Dongbing Wang; International Search Report mailed Mar. 28, 2012.
U.S. Appl. No. 12/783,707, filed May 20, 2010; Steven D. Liddiard; office action issued Jun. 22, 2012.
PCT Application PCT/US2011/046371; filed Aug. 3, 2011; Steven Liddiard; International Search Report mailed Feb. 29, 2012.
PCT Application PCT/US2010/056011; filed Nov. 9, 2010; Krysztof Kozaczek; International Search Report mailed Jul. 13, 2011.
Chakrapani et al.; Capillarity-Driven Assembly of Two-Dimensional Cellular Carbon Nanotube Foams; PNAS; Mar. 23, 2004; pp. 4009-4012; vol. 101; No. 12.

* cited by examiner

CARBON NANOTUBE MEMS ASSEMBLY

PRIORITY

Priority is claimed of U.S. Provisional Patent Application Ser. No. 60/995,881, filed Sep. 28, 2007, which is hereby incorporated herein by reference in its entirety.

RELATED APPLICATIONS

This application is related to U.S. patent application Ser. No. 12/239,281, filed Sep. 26, 2008, entitled Carbon Nanotube Assembly; and is related to U.S. patent application Ser. No. 12/239,339, filed Sep. 26, 2008, entitled X-Ray Radiation Window with Carbon Nanotube Frame, issued on Jul. 13, 2010 as U.S. Pat. No. 7,756,251.

BACKGROUND

Interest in the use of carbon nanotubes ("CNTs") in engineering applications continues to increase. CNTs are tubes of graphite typically grown from iron nanoparticles or iron, and can be categorized as single-walled nano-tubes ("SWNTs") or multi-walled nanotubes ("MWNTs"). CNTs have many interesting properties, including exhibiting the highest tensile strength and elastic modulus of any known material.

While the behavior of CNTs has been widely studied, the use of CNTs as structural components has proved problematic due to a variety of issues, including the difficulty of manipulating individual CNTs, the difficulty of incorporating CNTs into other structures, and the inherently fragile nature CNTs.

SUMMARY OF THE INVENTION

In accordance with one embodiment, the invention provides a carbon nanotube MEMS assembly, including a plurality of carbon nanotubes arranged into a patterned frame, the patterned frame defining at least two components of a MEMS device. An interstitial material can at least partially bind the carbon nanotubes one to another. At least one component of the frame can be fixed and at least one component of the frame can be free to move relative to the fixed component.

In accordance with another aspect of the invention, a method of forming a carbon nanotube MEMS assembly is provided, including: applying a catalyst to a substrate to create a defined pattern on the substrate; initiating growth of a plurality of carbon nanotubes from the catalyst applied in the pattern to form a patterned frame, the patterned frame including at least two components of a MEMS device; and releasing from the substrate at least one component of the MEMS device while leaving at least one component of the MEMS device fixed relative to the released component.

BRIEF DESCRIPTION OF THE DRAWINGS

Additional features and advantages of the invention will be apparent from the detailed description which follows, taken in conjunction with the accompanying drawings, which together illustrate, by way of example, features of the invention; and, wherein.

Figure 1:
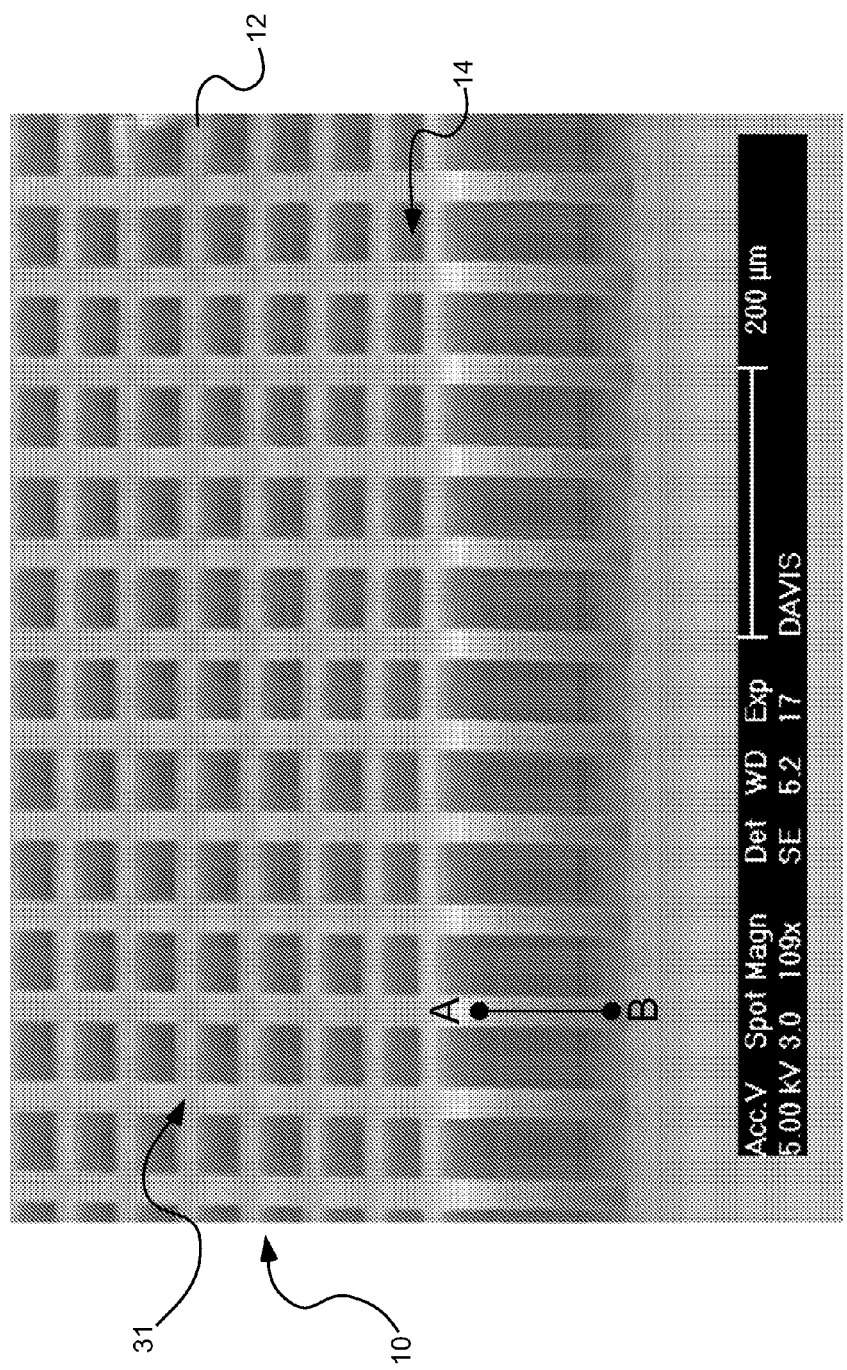
FIG. 1 is an SEM image of a high-density carbon nanotube assembly in accordance with an embodiment of the invention.

Reference will now be made to the exemplary embodiments illustrated, and specific language will be used herein to describe the same. It will nevertheless be understood that no limitation of the scope of the invention is thereby intended.

DETAILED DESCRIPTION OF EXAMPLE EMBODIMENTS

The following detailed description of exemplary embodiments of the invention makes reference to the accompanying drawings, which form a part hereof and in which are shown, by way of illustration, exemplary embodiments in which the invention may be practiced. While these exemplary embodiments are described in sufficient detail to enable those skilled in the art to practice the invention, it should be understood that other embodiments may be realized and that various changes to the invention may be made without departing from the spirit and scope of the present invention.

In describing and claiming the present invention, the following terminology will be used.

As used here, the term "vertically grown" is used to describe nanotubes that are generally grown upward from a substrate or catalyst material. While such nanotubes exhibit a generally vertical attitude, it is to be understood that such tubes are not necessarily perfectly straight or perfectly upright, but will tend to grow, twist or otherwise meander laterally to some degree, as would be appreciated by one of ordinary skill in the art.

As used herein, relative terms, such as "upper," "lower," "upwardly," "downwardly," "vertically," etc., are used to refer to various components, and orientations of components, of the systems discussed herein, and related structures with which the present systems can be utilized, as those terms would be readily understood by one of ordinary skill in the relevant art. It is to be understood that such terms are not intended to limit the present invention but are used to aid in describing the components of the present systems, and related structures generally, in the most straightforward manner. For example, one skilled in the relevant art would readily appreciate that a "vertically grown" carbon nanotube turned on its side would still constitute a vertically grown nanotube, despite its lateral orientation.

As used herein, the term "interstitial" material is used to refer to a material that at least partially fills interstices, or small spaces, between or in individual nanotubes that form an array of nanotubes.

As used herein, the term "patterned frame" is to be understood to refer to a framework or latticework or grate that includes an often planar base and an often planar face with constituent materials of the patterned frame arranged laterally relative to, and generally beginning or terminating at, the base and the face of the patterned frame. In most cases, the patterned frame will include one or more laterally extending walls that define, circumscribe or surround one or more passages extending through the frame from the base of the frame to the face of the frame.

One non-limiting example of a patterned frame in accordance with one aspect of the present invention is a grate structure having a repeating pattern of a plurality of intersecting walls that define a plurality of equally shaped and spaced passages. Such an exemplary grate structure is shown by example in FIGS. 1 and 2. Another non-limiting example of a patterned frame is exhibited by the MEMS device of FIGS. 3A and 3B.

As used herein, the term "passage" refers to an opening or a void formed in a patterned frame by the carbon nanotubes that define or constitute the frame. A passage can be completely devoid of material, or it can be filled, or partially filled, with an interstitial material used to fill interstices between and/or in the carbon nanotubes. In most cases, a passage that serves as an interstitial material access hole will include an opening size larger than interstices formed between adjacent nanotubes.

As used herein, the term "interlocked" is to be understood to refer to a relationship between two or more carbon nanotubes in which the nanotubes are held together, to at least some degree, by forces other than those applied by an interstitial coating or filling material (e.g., forces that exist prior to, or in the absence of, application of the interstitial material). Interlocked nanotubes may be intertwined with one another (e.g., wrapped about one another), or they may be held together by surface friction forces, van der Waals forces, and the like.

When nanotubes are discussed herein as being "linearly arranged" or "extending linearly," it is to be understood that the nanotubes, while possibly being slightly twisted, curved, or otherwise having a bodies that that meander in direction, are generally arranged or grown so as to extend lengthwise.

As used herein, the term "substantially" refers to the complete or nearly complete extent or degree of an action, characteristic, property, state, structure, item, or result. As an arbitrary example, when an object or group of objects is/are referred to as being "substantially" symmetrical, it is to be understood that the object or objects are either completely symmetrical or are nearly completely symmetrical. The exact allowable degree of deviation from absolute completeness may in some cases depend on the specific context. However, generally speaking the nearness of completion will be so as to have the same overall result as if absolute and total completion were obtained.

The use of "substantially" is equally applicable when used in a negative connotation to refer to the complete or near complete lack of an action, characteristic, property, state, structure, item, or result. As an arbitrary example, an opening that is "substantially free of" material would either completely lack material, or so nearly completely lack material that the effect would be the same as if it completely lacked material. In other words, an opening that is "substantially free of" material may still actually contain some such material as long as there is no measurable effect as a result thereof

INVENTION

The present invention provides systems and methods utilizing carbon nanotubes (sometimes referred to as "CNTs") in mechanically useful support structures and machines. In accordance with one aspect, the invention provides a high-density carbon nanotube assembly that includes a plurality of carbon nanotubes arranged into a patterned frame. The patterned frame can have a height of at least about 10 µm or greater. An interstitial material can at least partially fill interstices between at least some of the carbon nanotubes, and will also generally coat and/or bind together the outer surfaces of the patterned frame. The interstitial material will generally serve as a matrix binding the CNTs into a relatively rigid patterned frame having a shape generally corresponding to the shape outlined by the collective bodies of the CNTs.

Figure 2:
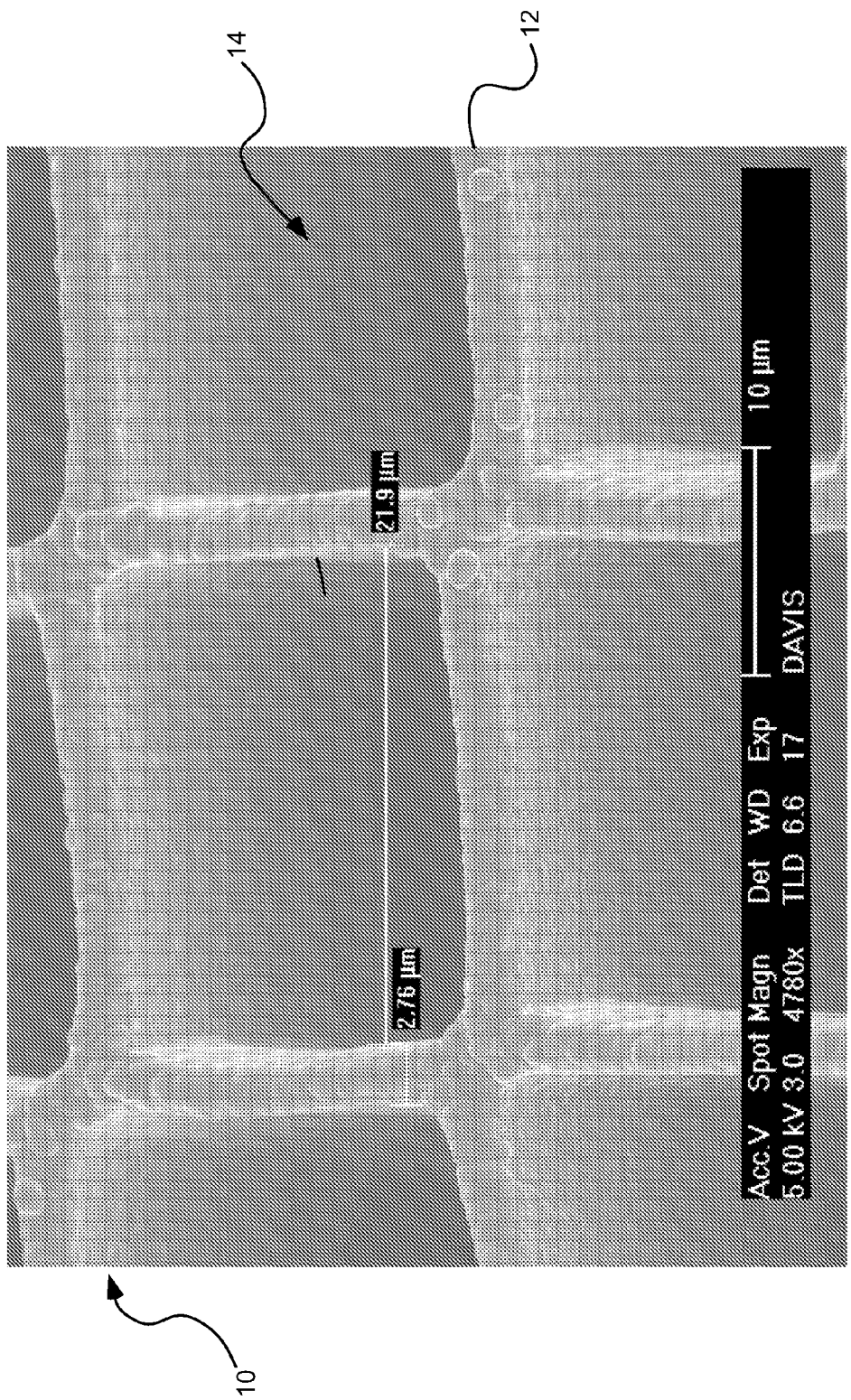
FIG. 2 is another SEM image of a high-density carbon nanotube assembly in accordance with an embodiment of the invention.

One exemplary patterned frame 10 is shown in the SEM image of FIG. 1. In this embodiment, the frame includes a series of walls 12 with a series of passages (e.g., openings or cavities) 14 defined therebetween. The walls 12 can extend in divergent directions, forming right angles relative to one another, or a variety of other angles (e.g., 30 degrees, 45 degrees, etc.), depending upon the desired pattern of the frame. The line A-B in FIG. 1 indicates the generally upright, vertical, or linear orientation of the CNTs that form or define the walls of the patterned frame (note that, due to the very small scale of the CNTs, individual CNTs are not visible in the SEM image of FIG. 1). The tubes in a typical assembly generally grow vertically up from a substrate, in a direction that is generally parallel to the line A-B. It can be seen from this indicative line that the regions where the CNTs grow form or define the walls of the patterned frame. A series of CNTs are illustrated schematically at 21 in FIG. 5.

As will be discussed in further detail below, the pattern, shape and geometry of the patterned frame can be relatively easily manipulated during the CNT growth process, providing a great deal of flexibility in designing patterned frames for a variety of uses. In the embodiment illustrated in FIG. 1, the patterned frame includes a series of walls that extend at right angles to one another to form a series of square passages. In other embodiments, the walls may run at 30, 45 or 60 degrees relative to one another, and form diamond-shaped passages, triangular-shaped passages, rectangular-shaped passages, etc. Also, circular-shaped passages can be formed should such a pattern be found advantageous.

The CNTs utilized in the patterned frame can take a variety of forms. The CNTs can include single-wall CNTs or multi-wall CNTs. One particular advantage of the present invention lies in the ability to form high density arrays of CNTs with high aspect ratios. Patterned frames with high and narrow walls can be precisely formed into a variety of desired frame configurations. In one aspect, the CNTs utilized can include heights on the order of 10 µm and greater. While not so required, the CNTs can include diameters as small as 20 nm or less. The CNTs can be grown or fabricated in a variety of manners, many of which will be familiar to those of ordinary skill in the art. An exemplary grouping of CNTs is illustrated schematically at 21 in FIG. 5. In this illustration, the generally linear arrangement of the CNTs from a base 33 of the frame 10 (or wall 12) to a face 31 of the frame can be appreciated.

While not so required, many of the patterned frames formed in accordance with the present invention will include a generally planar face and a generally planar base, with the CNTs of the frame extending from the face to the base. For example, FIG. 1 illustrates one exemplary patterned frame 10, with the face 31 of the frame being defined by upper portions of the CNTs which collectively form a grid surface. While the faces and bases of the various examples shown in the figures are generally planar, it is to be understood that the faces and/or the bases may include a curvature.

In one specific example of the invention, CNTs can be grown by first preparing a sample by applying 30 nm of alumina on an upper surface of a supporting silicon wafer. A patterned, 3-4 nm Fe film can be applied to the upper surface of the alumina. The resulting sample can be placed on a quartz "boat" in a one inch quartz tube furnace and heated from room temperature to about 750 degrees C. while flowing 500 sccm of $H_2$. When the furnace reaches 750 degrees C. (after about 8 minutes), a $C_2H_4$ flow can be initiated at 700 sccm (if slower growth is desired, the gases may be diluted with argon). After a desired CNT length (or height) is obtained, the $H_2$ and $C_2H_4$ gases can be removed, and Ar can be initiated at 350 sccm while cooling the furnace to about 200 degrees C. in about 5 minutes.

The above example generated multi-walled CNTs with an average diameter of about 8.5 nm and a density of about 9.0 $kg/m^3$. It was also found that the conditions above produced a CNT "forest" of high density, interlocked or intertwined CNTs that can be grown very tall while maintaining very narrow features in the patterned frame.

The intertwining of the CNTs during growth is advantageous in that the CNTs maintain a lateral pattern (generally defined by a catalyst from which the CNTs are grown) while growing vertically upward, as the CNTs maintain an attraction to one another during growth. Thus, rather than achieving random growth in myriad directions, the CNTs collectively maintain a common, generally vertical attitude while growing.

The interstitial material can be selected to provide the patterned frame with a variety of desirable characteristics. Generally speaking, the interstitial material can be selected to provide advantages tailored to the intended use of the patterned frame. Examples of suitable filler or interstitial material can include, without limitation, Si, $SiO_2$, $Si_3N_4$, SiC, aluminum oxide, zinc oxide, titanium oxide, titanium, tungsten, amorphous carbon, ceramics, other metals, other semiconductors, other oxides, and combinations thereof, to name only a few suitable materials. Examples of attributes for which the interstitial material can be selected to optimize include, without limitation: mechanical stability; rigidity; stiffness; toughness; electrical conductivity; molecular, chemical and ion transport and storage; piezoelectricity; ferroelectricity; high temperature stability; etc.

In one specific example, an assembly was formed by creating a forest of CNTs formed into a patterned frame (as outlined above). The frame was then filled and/or coated with an interstitial material by a low-pressure chemical vapor deposition ("LPCVD") process using undoped polycrystalline silicon. In this process, a LPCVD furnace was used at 200 mTorr and substrate temperature of 580 degrees C., flowing 20 sccm of $SiH_4$, for 2 hours and 50 minutes. This process resulted in a deposition rate on a planar surface (or a radial deposition rate on the carbon nanotubes) of about 1.8 nm/min. Upon completion, the LPCVD furnace was vented with $N_2$, and the sample was removed at a rate of about 1 cm/s.

In another specific example, the frame was filled and/or coated with an amorphous carbon interstitial material by an atmospheric CVD process. The filling or coating process was performed immediately after the growth of the CNT forest and prior to removal of the forest from the furnace. The temperature was raised to 900 degrees C. flowing Ar at 500 sccm. A one-hour carbon deposition with ethylene (25 sccm) and argon (225 sccm) followed by a 30 minute anneal at 1000 degrees C. (500 sccm of argon) substantially fills the CNT forest.

The present invention advantageously allows the selection of the interstitial material based upon an intended use, or desired attributes, of the resulting patterned frame. For example, in some applications, a greater or lesser degree of thermal or electrical conductivity may be desired. A greater or lesser degree of physical strength and/or weight may be desired. Resistance to various chemicals or environments can also be considerations that can affect selection of the interstitial material. The present invention can advantageously be adapted for a variety of materials to address these and other design goals.

Figure 5:
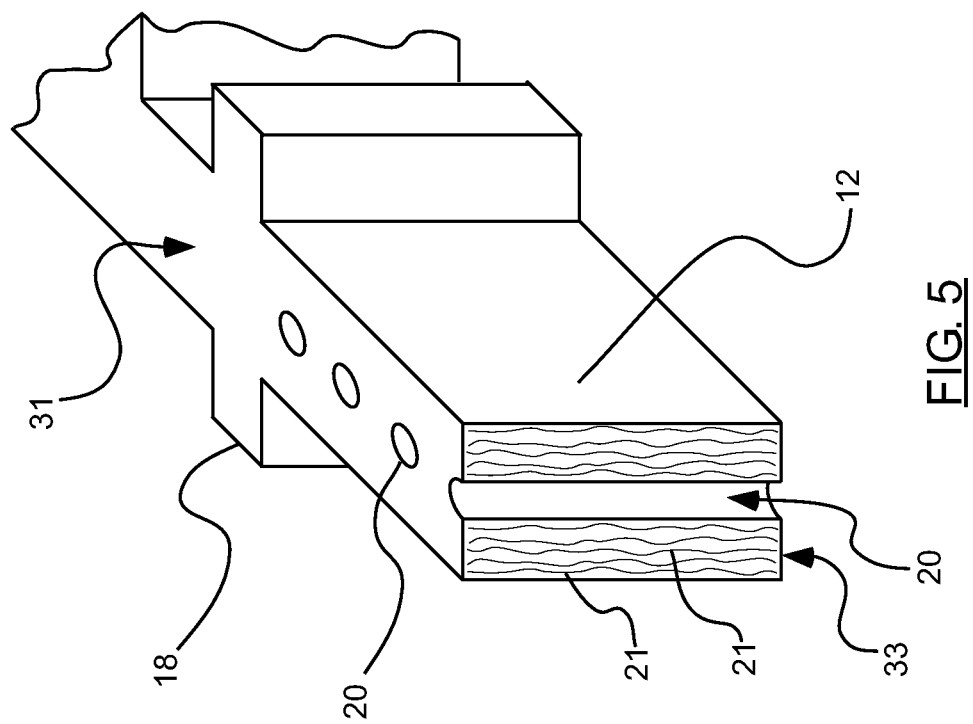
FIG. 5 is a partially sectioned view of a carbon nanotube frame assembly in accordance with an aspect of the invention.

While the present invention provides patterned CNT frames having high aspect ratios, the inventors have found that walls of patterned frames grown above certain heights can tend to "fold" over due to the large height-to-thickness ratio. To address this issue, reinforcing nubs, extensions, or protuberances can be formed in the walls of the patterned frame during growth of the frame. One exemplary protuberance 18 is illustrated in FIG. 5. The protuberance can provide rigidity to the wall to enable growth of taller and narrower wall features while avoiding unwanted "fold over" of the wall.

Figure 6:
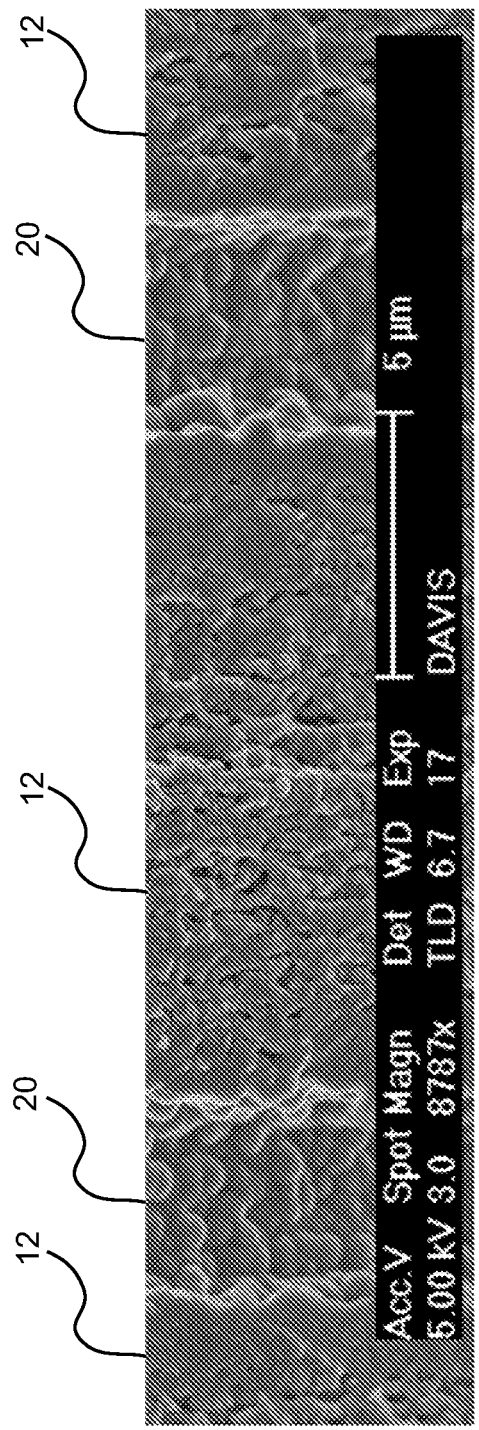
FIG. 6 is an SEM image of a portion of a cleaved carbon nanotube frame assembly in accordance with an embodiment of the invention, illustrating a series of interstitial material access openings formed therein.

Also illustrated in FIGS. 5 and 6 are a series of interstitial material access holes 20 that can be utilized to enhance the filling/coating process of the present invention. The access holes 20 can be formed so as to extend substantially fully from the base 33 of the wall to the face 31 of the wall. The material access holes can be substantially devoid of nanotubes and can serve to increase penetration of the interstitial material into the forest of CNTs to ensure a fully (or more fully) impregnated forest. Thus, a finished patterned frame 10 can include one or more passages (e.g., 14 in FIGS. 1 and 2) that are substantially devoid of any material, and interstitial material access holes 20 that are devoid of CNTs but that may be partially filled during the manufacturing process by the interstitial material (in many cases, the interstitial material access contain little or no interstitial material).

The interstitial material access holes 20 can be formed in a variety of manners. As will be discussed in further detail below, growth of the CNTs can be accomplished by applying a catalyst material to a substrate in a defined pattern. Where desired, voids can be created in the catalyst pattern as, or after, the catalyst is applied to the substrate. As the CNTs grow upwardly around these voids, the material access holes will be formed in the CNT forest. In one example, it was found that square access holes of about 3 μm in width, spaced 3 μm from one another, allowed a polysilicon interstitial material to fill the CNT forest to a depth about ten times greater than if the holes were not present (forest heights of 170 μm and taller have been formed using this method). FIG. 6 includes an SEM image of a sectioned wall of a patterned frame showing two interstitial material access holes formed in the wall.

Generally speaking, the passages 14 are of larger diameter or opening size than are the interstitial material access holes 20, which are in turn of larger diameter or opening size than are the interstices between adjacent CNTs. While not so required, in one embodiment of the invention adjacent CNTs are spaced about 200-300 nm from one another, with the interstitial material access holes formed having a diameter or opening size of about 3 to about 20 μm, and the larger passages formed with a diameter or opening size of 100 μm or greater. In some applications, the larger passages may be as small as 10 μm in diameter.

Figures 3A, 3B:
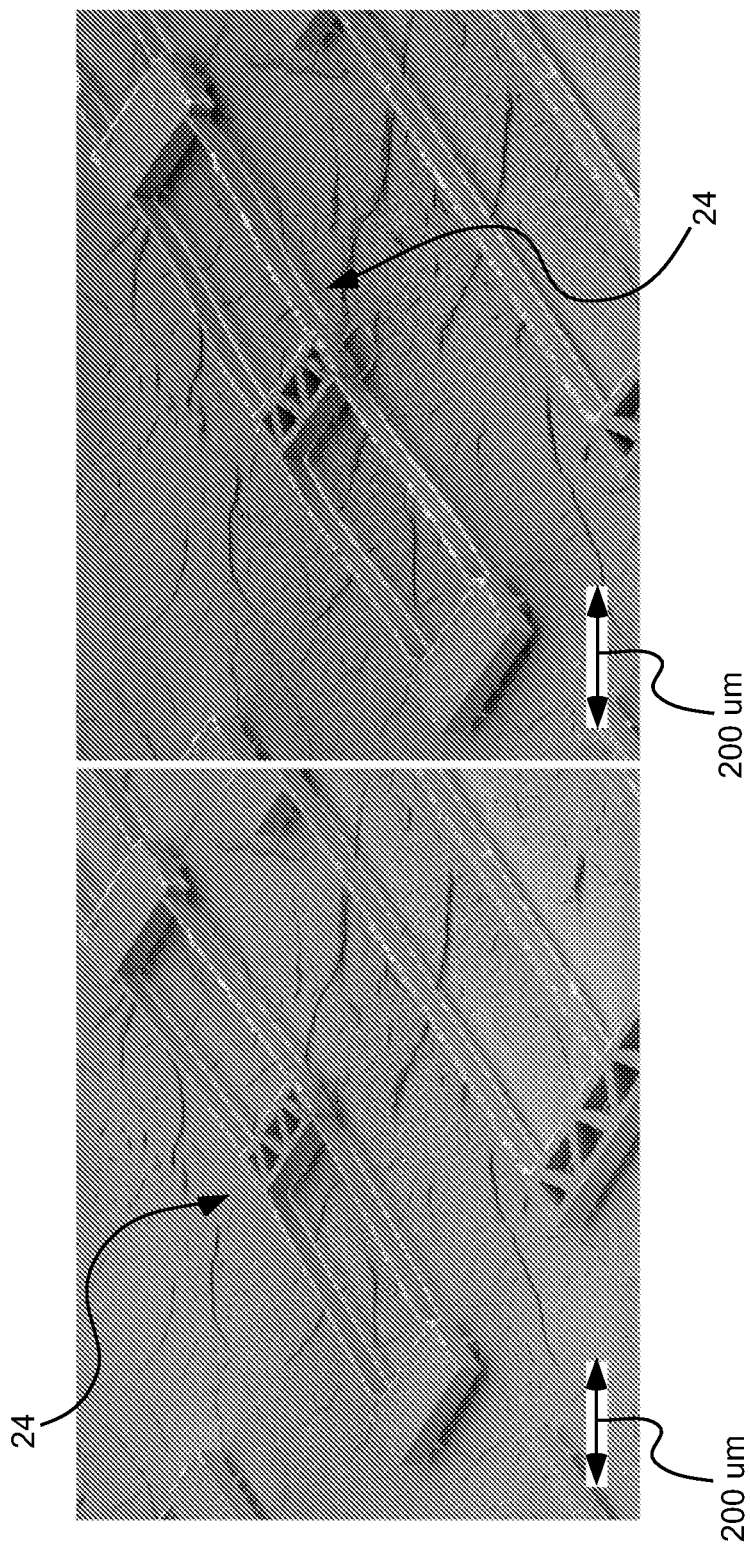
FIG. 3A is an SEM image of a carbon nanotube bistable mechanism in accordance with an embodiment of the invention.
FIG. 3B is an SEM image of the bistable mechanism of FIG. 3A, shown in a second position.

The patterned frames of the present invention can be advantageously used in a variety of applications. In one specific example, the frames can be utilized as microelectromechanical systems ("MEMS"), or as specific components of MEMS. Due to the flexibility provided by the manner in which the present frames can be formed (discussed in more detail below), frames with very small feature sizes can be constructed with a high degree of precision. These aspects make the present invention well suited for use in MEMS applications. One exemplary MEMS device is illustrated in FIGS. 3A and 3B. In this application, the techniques of the present invention were utilized to form a bistable mechanism 24. The bistable mechanism provides a mechanical manner in which a condition can be expressed as one of two positions (analogous to a computer "bit"—1 or 0). FIG. 3A illustrates the bistable mechanism in a first state, with the second state illustrated in FIG. 3B.

The example illustrated in FIGS. 3A and 3B was formed by filling a patterned frame of CNTs with silicone nitride. The silicon nitride was deposited at 720 degrees C. and 200 mTorr in an LPCVD furnace. The tube of the furnace was evacuated and $NH_3$ was flowed for 3 minutes at 14 sccm for a "pre-soak." The $NH_3$ flow was maintained and dichlorosilane was added at a flow rate of 10 sccm. After 3 hours, the dichlorosilane was turned off and $NH_3$ was allowed to continue flowing for 3 minutes to remove un-reacted dichlorosilane. Finally, the LPCVD tube was flushed and vented with $N_2$ and the sample was extracted at a rate of about 1 cm/s.

This process resulted in a nearly stoichiometric silicon nitride, evidenced by the index of refraction of a 200 nm film deposited on a planar Si substrate which was measured to be about 1.9 (compared to 2.0 for a truly stoichiometric $Si_3N_4$). In this example, the devices were not grown on a pre-deposited $SiO_2$ sacrificial layer (as discussed further below), but were instead grown on a Si wafer (with the necessary 30 nm alumina diffusion barrier layer). The underlying silicon was etched to release the devices in 45% KOH solution at 60 degrees C. for 70 minutes.

Other examples of MEMS applications for which the present invention are suitable include, without limitation, thermomechanical in-plane microactuators ("TIMs"), comb drives, sensors, cantilevers, etc.

Figure 4:
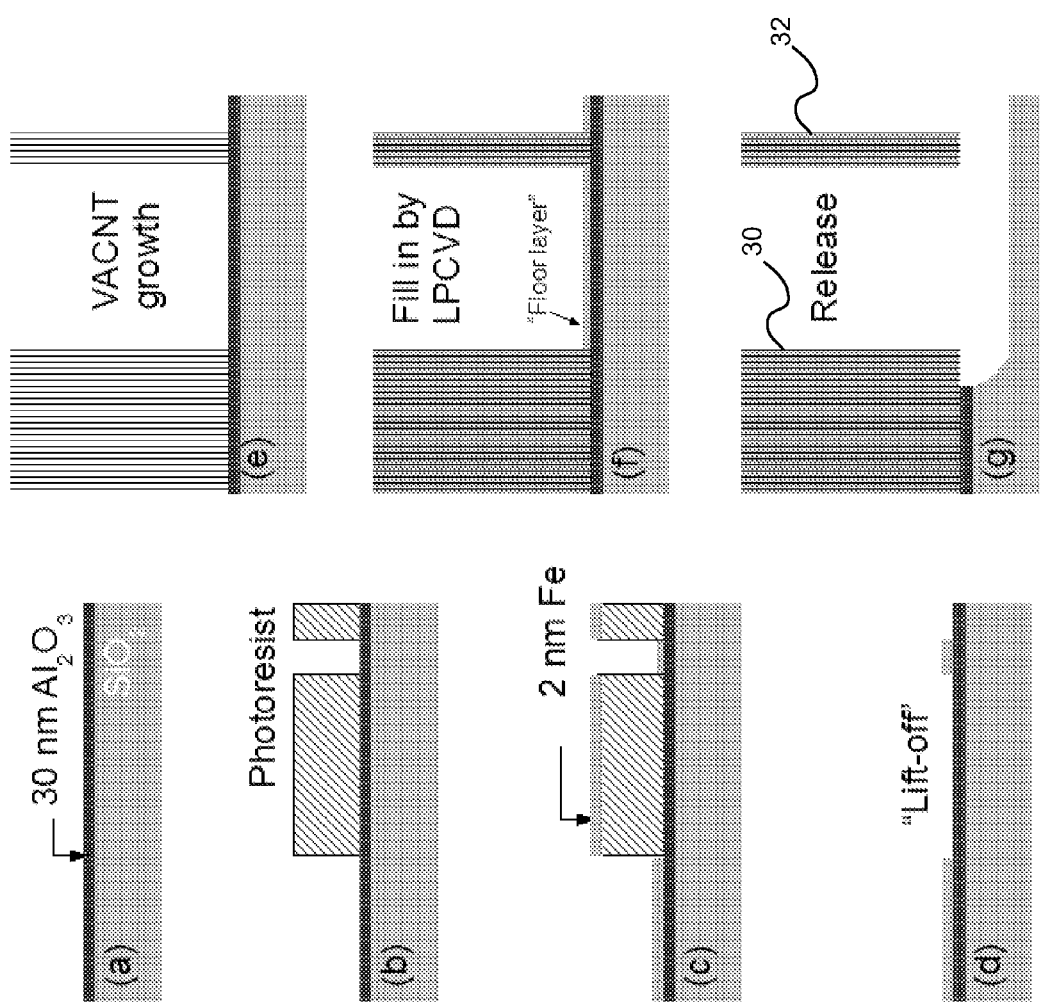
FIG. 4 illustrates a series of intervals of a fabrication process used in forming a carbon nanotube frame assembly in accordance with an aspect of the invention.

Formation of the patterned frames can be accomplished in a variety of manners. FIG. 4 illustrates a series of processes exemplary of one manner of doing so. The process can begin at frame (a) of FIG. 4., where 30 nm of alumina is evaporated by electron beam evaporation onto a $SiO_2$ substrate. At (b), AZ330 photo resist is spun and patterned (note that the pattern is not evident from the view of FIG. 4—it would be apparent from a top view of the substrate). At (c), 4 nm of Fe is thermally evaporated on top of the photo resist. At (d), the photo resist is lifted off in a resist stripper. At (e), a forest of generally vertically-aligned CNTs is grown from the patterned iron film by chemical vapor deposition at 750 degrees C. using $C_2H_4$ and $H_2$ feedstock gases (note that, while the CNTs are shown schematically as generally straight and upright, there will likely be a considerable amount of intertwining of the CNTs as they are grown). At (f), the CNT forest is coated (and/or infiltrated, bound together, etc., depending upon the materials utilized) with Si or other suitable materials by various chemical vapor deposition processes (e.g., low-pressure, atmospheric, high-pressure CVD, etc.).

It will be appreciated by one of ordinary skill in the art having possession of this disclosure that the infiltration step illustrated in frame (f) will often result in a "floor layer" of interstitial or infiltration material being applied near the base of the patterned frame within the passages defined by the CNTs (e.g., at the bottom of "wells" or "cups" formed by the passages and the $Al_2O_3$). This floor layer can be removed in order to expose the underlying sacrificial layer for etching. The removal of the floor layer can be accomplished in a number of manners.

In one aspect of the invention, a short reactive ion etch can be utilized. For example, a Reactive Ion Etch (RIE) can be accomplished at 100 W, 100 mTorr, flowing 3.1 sccm of $O_2$ and 25 sccm of $CF_4$, etching for 5-9 minutes (depending on the size of the features being etched). In another example, a $CH_3F/O_2$ Inductively Coupled Plasma RIE etch can be utilized. It is also contemplated that a wet etch can be utilized, for example by placing the sample in KOH or a similar solution to etch away the floor layer.

While each of these process may result etching or removing some of the interstitial material from the CNT forest, it has been found that the floor layer is removed before significant etching of the structure CNT structure occurs. Generally speaking, creation of the "floor layer," and subsequent removal of the floor layer, will be considerations in most of the processes utilized in coating or infiltrating the CNT patterned frame of the present invention.

At (g), the underlying $SiO_2$ is etched to release portions of the structure. This can be accomplished in a number of manners, including by immersion in HF. The resulting patterned frame will, in the example shown, include some portions that remain attached to the substrate (e.g., portion 30 of frame (g)), while other portions (e.g., portion 32 of frame (g)) have been removed from the substrate. Depending upon the desired use of the patterned frame, all of the frame could be left attached to the substrate, only some of the frame can be removed from the substrate (to form, for example, moveable portions for use in MEMS applications), or all of the frame can be removed from the substrate.

Removal of the frame from the substrate can be accomplished in a number of manners. In one embodiment, the frame can be simply pried off the substrate using mechanical force. Other embodiments can include the use of an etching process to remove the underlying sacrificial layer (e.g., $SiO_2$ in the example given above) or to attack the interface between layers to release the frame from the substrate.

In addition to the process steps outlined above, in some embodiments of the invention, a densification process can be implemented prior to applying the interstitial material to the CNTs arranged into the patterned frame. For example, in one embodiment, CNT "forest" can be exposed to ethanol vapor prior to being exposed to a Si interstitial material to densify the CNTs. This process was found to decrease feature size by as much as 10-100 times.

While the forgoing examples are illustrative of the principles of the present invention in one or more particular applications, it will be apparent to those of ordinary skill in the art that numerous modifications in form, usage and details of implementation can be made without the exercise of inventive faculty, and without departing from the principles and concepts of the invention. Accordingly, it is not intended that the invention be limited, except as by any claims associated with this or related applications.

We claim:

1. A carbon nanotube MEMS assembly, comprising:
   a plurality of carbon nanotubes oriented in a generally linear orientation into a patterned frame, the plurality of nanotubes extending vertically from a base of the frame to a face of the frame, the patterned frame defining at least two components of a MEMS device, the frame comprising one or more passages;
   an interstitial material, at least partially binding adjacent carbon nanotubes one to another;
   at least one component of the frame being fixed and at least one component of the frame being movable relative to the fixed component;
   wherein the nanotubes oriented into the frame define in the frame one or more interstitial material access holes, wherein each of the interstitial material access holes extends from the face of the frame to the base of the frame and is substantially devoid of nanotubes;
   wherein the one or more passages are substantially devoid of nanotubes coated with the interstitial material, and wherein the size of the one or more passages is greater than the size of the one or more interstitial material access holes.

2. The MEMS assembly of claim 1, wherein the at least one fixed component is attached to a substrate.

3. The MEMS assembly of claim 1, wherein the size of the interstitial material access holes is greater than the size of interstices between adjacent nanotubes.

4. The MEMS assembly of claim 3, wherein adjacent nanotubes are interlocked one with another.

5. The MEMS assembly of claim 3, wherein the size of the one or more passages is 10 microns or greater and the size of the one or more interstitial material access holes is from about 3 to about 20 microns.

6. The MEMS assembly of claim 5, wherein the interstitial material access holes have a size larger than an interstice between adjacent nanotubes.

7. The MEMS assembly of claim 1, wherein the assembly comprises a thermomechanical in-plane microactuator.

8. The MEMS assembly of claim 1, wherein the assembly comprises a comb drive.

9. The MEMS assembly of claim 1, wherein the assembly comprises a bistable mechanism.

10. The MEMS assembly of claim 1, wherein the interstitial material comprises a material applied by a vapor deposition process.

11. The MEMS assembly of claim 10, wherein the interstitial material floor layer in areas adjacent to movable components is removed to enable the release etch.

12. The MEMS assembly of claim 11, wherein the floor layer adjacent to the movable parts is removed via Reactive Ion Etching.

13. The MEMS assembly of claim 1, wherein each of the plurality of carbon nanotubes extends substantially linearly from the base of the frame to the face of the frame.

* * * * *